(12) United States Patent
Oh et al.

(10) Patent No.: US 10,748,871 B2
(45) Date of Patent: Aug. 18, 2020

(54) SEMICONDUCTOR CHIP AND SEMICONDUCTOR PACKAGE INCLUDING THE SAME

(71) Applicant: Samsung Electronics Co., Ltd., Suwon-si (KR)

(72) Inventors: Seong Hwan Oh, Yongin-si (KR); Kyung Suk Oh, Seongnam-si (KR); Kilsoo Kim, Hwaseong-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/164,524

(22) Filed: Oct. 18, 2018

(65) Prior Publication Data
US 2019/0295986 A1    Sep. 26, 2019

(30) Foreign Application Priority Data

Mar. 26, 2018    (KR) .......................... 10-2018-0034454

(51) Int. Cl.
*H01L 25/065*    (2006.01)
*H01L 21/78*    (2006.01)
(Continued)

(52) U.S. Cl.
CPC .......... *H01L 25/0652* (2013.01); *H01L 21/78* (2013.01); *H01L 24/05* (2013.01); *H01L 24/09* (2013.01); *H01L 24/13* (2013.01); *H01L 24/16* (2013.01); *H01L 24/17* (2013.01); *H01L 24/32* (2013.01); *H01L 24/48* (2013.01); *H01L 24/49* (2013.01); *H01L 24/73* (2013.01); *H01L 25/0657* (2013.01); *H01L 25/50* (2013.01);
(Continued)

(58) Field of Classification Search
CPC ......... H01L 24/42; H01L 24/48; H01L 24/49; H01L 25/0652; H01L 25/0657; H01L 2224/16145; H01L 2224/32145; H01L 2224/97
See application file for complete search history.

(56) References Cited

U.S. PATENT DOCUMENTS 6,897,096 B2    5/2005    Cobbley et al.
8,445,321 B2    5/2013    Fukuda
(Continued)

FOREIGN PATENT DOCUMENTS

JP    5936968 B2    6/2016

*Primary Examiner* — David C Spalla
(74) *Attorney, Agent, or Firm* — Muir Patent Law, PLLC

(57) ABSTRACT

A semiconductor package may include a package substrate, a first semiconductor chip on the package substrate, and a second semiconductor chip on the first semiconductor chip. The first semiconductor chip comprises a chip substrate including a first surface and a second surface opposite to the first surface, a plurality of first chip pads between the package substrate and the chip substrate, and electrically connecting the first semiconductor chip to the package substrate, a plurality of second chip pads disposed on the second surface and between the second semiconductor chip and the second surface, and a plurality of redistribution lines on the second surface, the redistribution lines electrically connecting to the second semiconductor chip, and a plurality of bonding wires electrically connecting the redistribution lines to the package substrate.

19 Claims, 17 Drawing Sheets

(51) Int. Cl.
*H01L 23/00* (2006.01)
*H01L 25/00* (2006.01)

(52) U.S. Cl.
CPC .............. *H01L 24/29* (2013.01); *H01L 24/45* (2013.01); *H01L 2224/02313* (2013.01); *H01L 2224/02373* (2013.01); *H01L 2224/02375* (2013.01); *H01L 2224/02381* (2013.01); *H01L 2224/0401* (2013.01); *H01L 2224/04042* (2013.01); *H01L 2224/05569* (2013.01); *H01L 2224/05624* (2013.01); *H01L 2224/05647* (2013.01); *H01L 2224/05655* (2013.01); *H01L 2224/09134* (2013.01); *H01L 2224/09135* (2013.01); *H01L 2224/09177* (2013.01); *H01L 2224/09181* (2013.01); *H01L 2224/13025* (2013.01); *H01L 2224/13101* (2013.01); *H01L 2224/13124* (2013.01); *H01L 2224/13139* (2013.01); *H01L 2224/13147* (2013.01); *H01L 2224/13169* (2013.01); *H01L 2224/16145* (2013.01); *H01L 2224/16146* (2013.01); *H01L 2224/16225* (2013.01); *H01L 2224/16227* (2013.01); *H01L 2224/17181* (2013.01); *H01L 2224/2919* (2013.01); *H01L 2224/32145* (2013.01); *H01L 2224/45144* (2013.01); *H01L 2224/48091* (2013.01); *H01L 2224/48145* (2013.01); *H01L 2224/48227* (2013.01); *H01L 2224/49112* (2013.01); *H01L 2224/49171* (2013.01); *H01L 2224/73257* (2013.01); *H01L 2224/73265* (2013.01); *H01L 2224/83101* (2013.01); *H01L 2225/0651* (2013.01); *H01L 2225/06506* (2013.01); *H01L 2225/06513* (2013.01); *H01L 2225/06517* (2013.01); *H01L 2924/10252* (2013.01); *H01L 2924/10253* (2013.01); *H01L 2924/10271* (2013.01); *H01L 2924/1431* (2013.01); *H01L 2924/1434* (2013.01); *H01L 2924/15311* (2013.01); *H01L 2924/181* (2013.01)

(56) References Cited

U.S. PATENT DOCUMENTS

| | | | |
|---|---|---|---|
| 8,637,983 B2 | 1/2014 | Martinez et al. | |
| 8,786,102 B2 | 7/2014 | Yoshida et al. | |
| 8,916,875 B2 | 12/2014 | Lee | |
| 8,941,246 B2 | 1/2015 | Miura et al. | |
| 9,287,249 B2 | 3/2016 | Kinoshita et al. | |
| 2003/0141582 A1 | 7/2003 | Yang et al. | |
| 2004/0251531 A1* | 12/2004 | Yang | H01L 21/563 257/686 |
| 2008/0265397 A1* | 10/2008 | Lin | H01L 25/0657 257/691 |
| 2010/0084753 A1* | 4/2010 | Park | H01L 23/3128 257/686 |
| 2011/0018121 A1* | 1/2011 | Lee | H01L 21/76898 257/692 |
| 2013/0187292 A1* | 7/2013 | Semmelmeyer | H01L 25/0652 257/777 |

\* cited by examiner

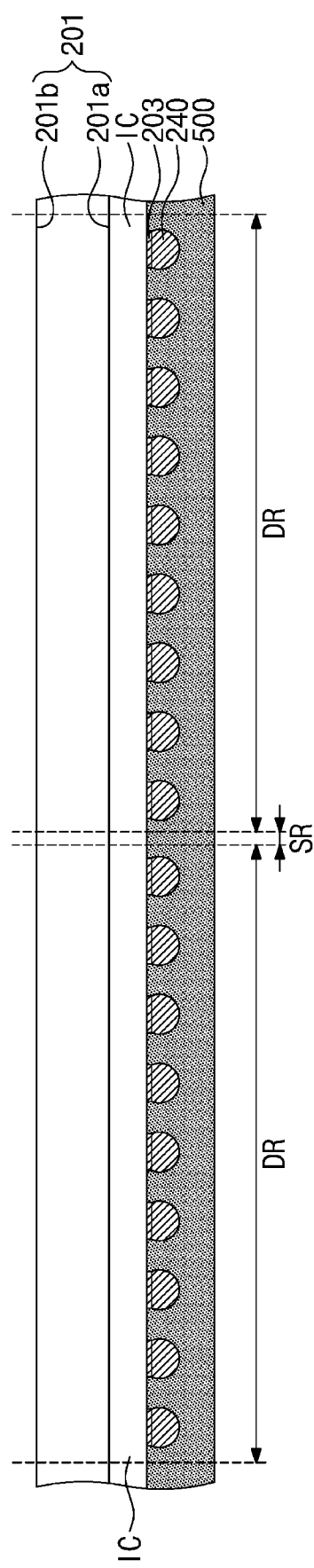

SEMICONDUCTOR CHIP AND SEMICONDUCTOR PACKAGE INCLUDING THE SAME

CROSS-REFERENCE TO RELATED APPLICATION

This U.S. nonprovisional application claims priority under 35 U.S.C § 119 to Korean Patent Application No. 10-2018-0034454 filed on Mar. 26, 2018 in the Korean Intellectual Property Office, the entire contents of which are hereby incorporated by reference.

BACKGROUND

Inventive concepts relate to a semiconductor chip and a semiconductor package including the same, and more particularly, to a semiconductor chip comprising a redistribution layer and a semiconductor package including the same.

Semiconductor devices are widely used in the electronic industry because of their small size, multi-functionality, and/or low fabrication cost. Semiconductor devices may encompass memory devices for storing data, logic devices for processing data, and hybrid devices for operating various functions simultaneously.

Semiconductor devices have been increasingly required for high integration with the advanced development of the electronic industry. Semiconductor devices also have been increasingly requested for high speed with the advanced development of the electronic industry. Various studies have been conducted to meet the requirements of high integration and/or high speed in semiconductor devices.

SUMMARY

Some embodiments of inventive concepts provide a semiconductor package with increased heat radiation.

Some embodiments of inventive concepts provide a semiconductor package with improved electrical characteristics.

Some embodiments of inventive concepts provide a semiconductor chip comprising a redistribution layer.

An object of inventive concepts is not limited to the mentioned above, and other objects which have not been mentioned above will be clearly understood to those skilled in the art from the following description.

According to some exemplary embodiments, a semiconductor package may comprise: a package substrate; a first semiconductor chip on the package substrate, and a second semiconductor chip on the first semiconductor chip. The first semiconductor chip may comprise: a chip substrate including a first surface and a second surface opposite to the first surface, a plurality of first chip pads between the package substrate and the chip substrate, and electrically connecting the first semiconductor chip to the package substrate, a plurality of second chip pads disposed on the second surface and between the second semiconductor chip and the second surface, a plurality of redistribution lines on the second surface, the redistribution lines electrically connecting to the second semiconductor chip; and a plurality of first bonding wires electrically connecting the redistribution lines to the package substrate.

According to some exemplary embodiments, a semiconductor package may comprise: a package substrate; a first semiconductor chip on the package substrate, and a second semiconductor chip on the first semiconductor chip. The first semiconductor chip may comprise: a chip substrate comprising a first surface and a second surface opposite to the first surface; a plurality of first chip pads between the package substrate and the chip substrate, and the first chip pads electrically connecting a plurality of integrated circuits of the first semiconductor chip to the package substrate; a plurality of second chip pads disposed on the second surface and between the second semiconductor chip and the second surface; a plurality of redistribution lines on the second surface, the redistribution lines electrically connected to the second semiconductor chip; and a plurality of bonding wires electrically connecting the redistribution lines to the package substrate.

According to some exemplary embodiments, a semiconductor device may comprise: a package substrate; a first semiconductor chip on the package substrate; and a second semiconductor chip disposed on and electrically connected to the first semiconductor chip. The first semiconductor chip comprises: a chip substrate including a first surface and a second surface opposite to the first surface; an integrated circuit region including a plurality of integrated circuits adjacent to the first surface of the chip substrate; a plurality of first chip pads at the first surface of the chip substrate, the first chip pads electrically connected to the integrated circuits; and a plurality of redistribution lines on the second surface of the chip substrate, the redistribution lines electrically connected to the package substrate through connection members. The redistribution lines may be spaced apart from the integrated circuit region.

BRIEF DESCRIPTION OF THE DRAWINGS

FIGS. 9A to 9H illustrate cross-sectional views showing a method of fabricating a semiconductor package according to exemplary embodiments of inventive concepts.

DETAILED DESCRIPTION

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly connected," to each other may be connected through one or more conductors, such as, for example, wires, pads, internal electrical lines, through vias, etc., and may form the same electrical node. As such, directly connected components do not include components connected through active elements, such as transistors or diodes (although such connections may form an electrical connection). Directly connected elements may be directly physically connected (e.g., in contact with each other).

Figure 1:
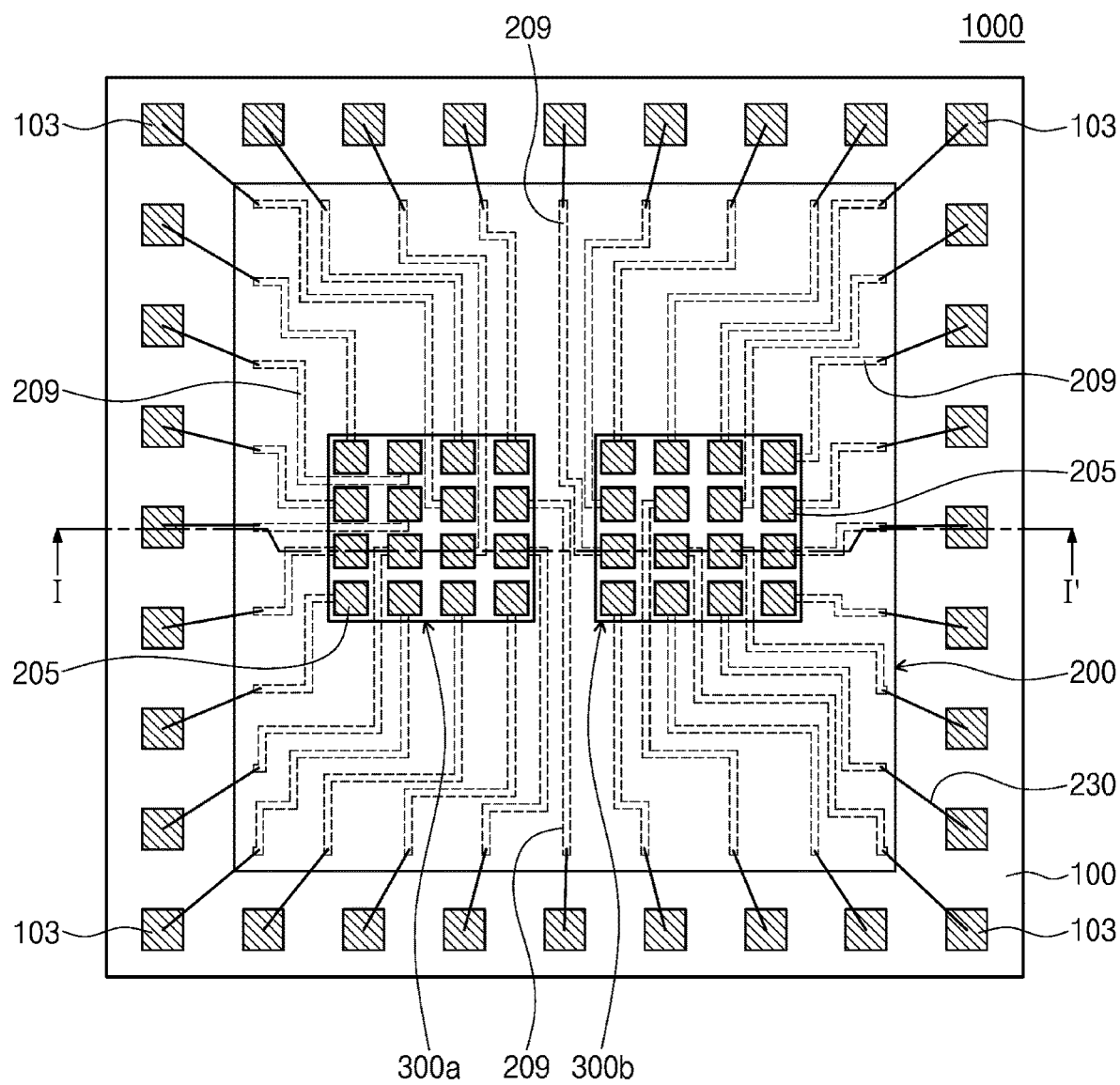
FIG. 1 illustrates a plan view showing a semiconductor package according to exemplary embodiments of inventive concepts.
Figure 2A:
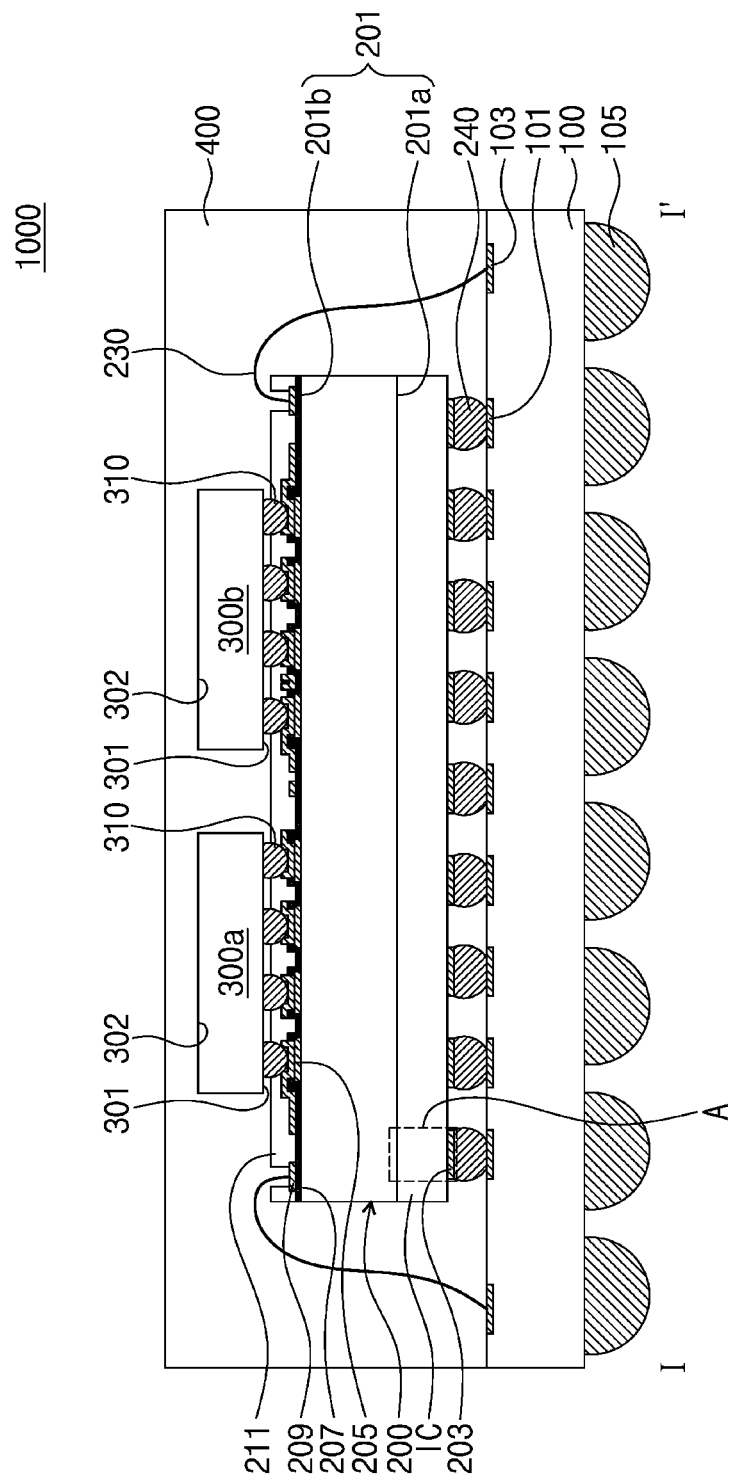
FIG. 2A illustrates a cross-sectional view taken along line I-I' of FIG. 1, showing a semiconductor package according to exemplary embodiments of inventive concepts.
Figure 2B:
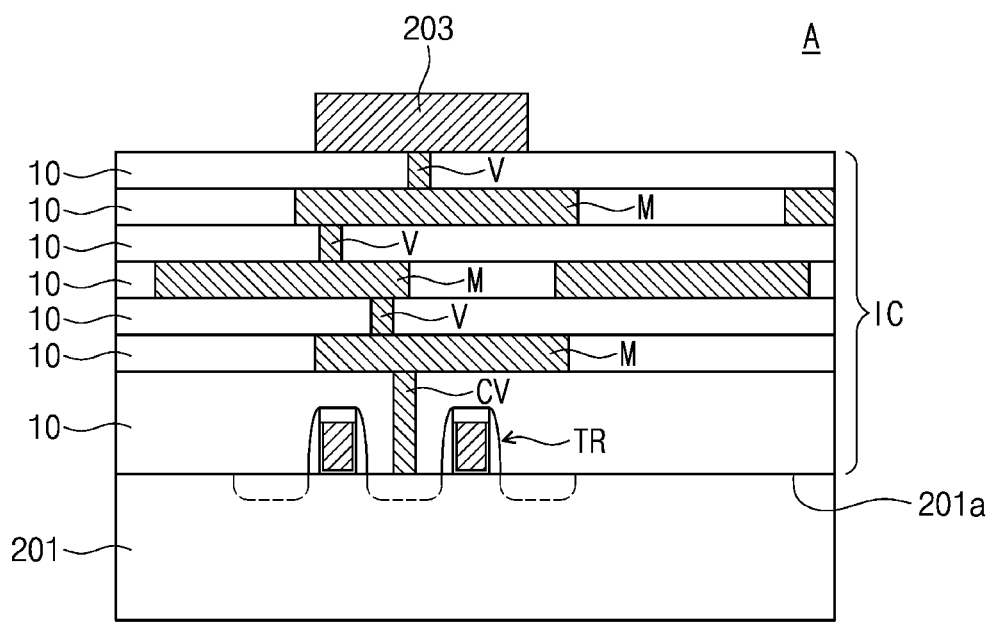
FIG. 2B illustrates an enlarged view showing section A of FIG. 2A.

FIG. 1 illustrates a plan view showing a semiconductor package according to exemplary embodiments of inventive concepts. FIG. 2A illustrates a cross-sectional view taken along line I-I' of FIG. 1, showing a semiconductor package according to exemplary embodiments of inventive concepts. FIG. 2B illustrates an enlarged view showing section A of FIG. 2A.

Referring to FIGS. 1, 2A, and 2B, a semiconductor package 1000 may include a package substrate 100, a first semiconductor chip 200, a second semiconductor chip 300a, a third semiconductor chip 300b, and a molding layer 400.

The first semiconductor chip 200 may be disposed on the package substrate 100. The package substrate 100 may be or include, for example, a printed circuit board (PCB). The package substrate 100 may include first pads 101 and second pads 103. The first pads 101 and the second pads 103 may be disposed on a top surface of the package substrate 100. The first pads 101 may be spaced apart from each other in a first direction and a second direction intersecting the first direction. The second pads 103 may be spaced apart from each other along an edge of the package substrate 100. External terminals 105 may be disposed on a bottom surface of the package substrate 100, which the bottom surface is opposite to the top surface of the package substrate 100. The external terminals 105 may be attached onto the bottom surface of the package substrate 100. The external terminals 105 may electrically connect the package substrate 100 to an external apparatus. The external terminals 105 may include, for example, solder bumps or solder balls.

The first semiconductor chip 200 may include a substrate (e.g., a chip substrate) 201, an integrated circuit region IC, first chip pads 203, second chip pads 205, a first insulation layer 207, redistribution lines 209, and a second insulation layer 211. The substrate 201 may be or include, for example, a silicon substrate, a germanium substrate, or a silicon-germanium substrate. The substrate 201 may have a first surface 201a and a second surface 201b opposite to the first surface 201a. The substrate 201 may be configured in such a way that the first surface 201a is closer than the second surface 201b to the package substrate 100.

The integrated circuit region IC may be disposed in the substrate 201 and on the first surface 201a of the substrate 201. The integrated circuit region IC may include a plurality of internal circuits. In some examples, the internal circuits may include transistors TR disposed in the substrate 201 and on the first surface 201a of the substrate 201, a contact via CV, a plurality of interlayer dielectric layers 10 sequentially stacked on the first surface 201a of the substrate 201, metal lines M disposed in the interlayer dielectric layers 10, and vias V that penetrate the interlayer dielectric layers 10 and electrically connect the metal lines M disposed in different interlayer dielectric layers 10. In some examples, the internal circuits may include at least one of a driver circuit, a receiver circuit, a transceiver circuit, a control circuit, a power circuit, etc. The contact via CV may electrically connect at least one transistor TR (e.g., a source/drain region thereof) to the metal lines M. The transistors TR may be constituent parts of a control circuit and/or a power circuit. In some embodiments, the first semiconductor chip 200 may be a semiconductor logic chip.

The first chip pads 203 may be disposed on the first surface 201a of the substrate 201. For example, the first chip pads 203 may be disposed on the interlayer dielectric layer 10 at the top level from the first surface 201a of the substrate 201. The first chip pads 203 may be spaced apart from each other in the first direction and the second direction intersecting the first direction. The first chip pads 203 may be in contact with internal circuits in the integrated circuit region IC. For example, the first chip pads 203 may be electrically connected to the transistors TR. For example, each of the first chip pads 203 may be electrically connected to at least one transistor TR through the vias V, the metal lines M, and the contact via CV.

The second chip pads 205 may be disposed on the second surface 201b of the substrate 201. In some examples, the second chip pads 205 may be disposed on and may contact a portion of the redistribution lines 209. The second chip pads 205 may be spaced apart from each other in the first direction and the second direction intersecting the first direction. In the first semiconductor chip 200, the second chip pads 205 may be spaced apart from the integrated circuit region IC. For example, in the first semiconductor chip 200, the second chip pads 205 may not be electrically connected to the transistors TR of the integrated circuit region IC.

The first insulation layer 207 may be disposed on the second surface 201b of the substrate 201. The first insulation layer 207 may cover the second surface 201b of the substrate 201 and expose top surfaces of the second chip pads 205. In some examples, the first insulation layer 207 may cover the second surface 201b of the substrate 201 and expose top surfaces of the redistribution lines 209. The first insulation layer 207 may include a single layer or a plurality of layers. The first insulation layer 207 may include, for example, one or more of a silicon oxide layer, a silicon nitride layer, and a silicon oxynitride layer.

The redistribution lines 209 may be disposed on the second surface 201b of the substrate 201. The redistribution lines 209 may be spaced apart from each other. The redistribution lines 209 may partially cover a top surface of the first insulation layer 207. The redistribution lines 209 may be correspondingly electrically connected to the second chip pads 205. For example, the redistribution lines 209 may contact and be electrically connected to the second chip pads 205 in one-to-one correspondence. On the second surface 201b of the substrate 201, the redistribution lines 209 may have linear shapes extending from the second chip pads 205 toward side surfaces of the substrate 201. On the second surface 201b of the substrate 201, each of the redistribution lines 209 may have one end in contact with the second chip pad 205 and other end adjacent to the side surface of the substrate 201. For example, the other ends of the redistribution lines 209 may be spaced apart from the second chip pads 205 and positioned on an edge of the substrate 201. The redistribution lines 209 may each include a single metal layer or a plurality of metal layers. The redistribution lines 209 may include, for example, one or more of aluminum (Al), nickel (Ni), and copper (Cu).

In the first semiconductor chip 200, the redistribution lines 209 may be spaced apart from the integrated circuit region IC. For example, in the first semiconductor chip 200, the redistribution lines 209 may not be electrically connected to the transistors TR of the integrated circuit region IC. FIG. 1 exemplarily shows the number and arrangement of the redistribution lines 209, but inventive concepts are not limited to that shown.

In some embodiments, an active surface of the first semiconductor chip 200 may include one surface of each of the first chip pads 203, and an inactive surface of the first semiconductor chip 200 may include one surface of each of the second chip pads 205 and one surface of each of the redistribution lines 209. For example, the active surface of the first semiconductor chip 200 may represent a first surface on which the first chip pads 203 electrically connected to the internal circuits of the integrated circuit region IC are disposed and the inactive surface of the first semiconductor chip 200 may represent a second surface opposite to the first surface on which the second chip pads 205 not electrically connected to the internal circuits of the integrated circuit region IC are disposed. For example, the first chip pads 203 may be formed adjacent to the internal circuits of the integrated circuit region IC, and the second chip pads 205 may be formed spaced apart from the internal circuits of the integrated circuit region IC.

The second insulation layer 211 may be disposed on the redistribution lines 209 and the first insulation layer 207. The second insulation layer 211 may partially expose the redistribution lines 209. For example, the second insulation layer 211 may expose the other ends of the redistribution lines 209 and the one ends of the redistribution lines 209, which the one ends are in contact with the second chip pads 205. In some examples, the second insulation layer 211 may expose the second chip pads 205 and the other ends of the redistribution lines 209, which the other ends are disposed adjacent to the side surfaces of the substrate 201. The second insulation layer 211 may include a single layer or a plurality of layers. The second insulation layer 211 may include, for example, a silicon oxide layer, a silicon nitride layer, or a silicon oxynitride layer.

Bonding wires 230 may be disposed between the other ends of the redistribution lines 209 and the second pads 103 of the package substrate 100, thereby electrically connecting the redistribution lines 209 to the second pads 103. For example, the package substrate 100 and the first semiconductor chip 200 may not be electrically connected to each other through the bonding wires 230. The bonding wires 230 may include, for example, gold (Au).

The package substrate 100 and the first semiconductor chip 200 may be provided therebetween with terminals (or, connection members) 240. For example, the terminals 240 may be disposed between the first chip pads 203 and the first pads 101. The terminals 240 may be in contact with the first chip pads 203. The terminals 240 may be electrically connected to the internal circuits of the integrated circuit region IC (e.g., transistors TR). For example, the terminals 240 may electrically connect the first semiconductor chip 200 to the package substrate 100.

The second semiconductor chip 300a and the third semiconductor chip 300b may be disposed on the first semiconductor chip 200. For example, the second and third semiconductor chips 300a and 300b may be disposed on the second surface 201b of the substrate 201. The second and third semiconductor chips 300a and 300b may be horizontally spaced apart from each other. Each of the second and third semiconductor chips 300a and 300b may vertically overlap the second chip pads 205. Each of the second and third semiconductor chips 300a and 300b may include one surface 301 and other surface 302 opposite to the one surface 301. The one surface 301 of each of the second and third semiconductor chips 300a and 300b may be closer than the other surface 302 to the first semiconductor chip 200. In some embodiments, the second and third semiconductor chips 300a and 300b may be semiconductor memory chips.

Connection members (or, terminals) 310 may be disposed between the first semiconductor chip 200 and each of the second and third semiconductor chips 300a and 300b. For example, connection members 310 may be disposed between the second chip pads 205 and the one surface 301 of each of the second and third semiconductor chips 300a and 300b. Each connection members 310 may contact the one end of a redistribution line 209. In some examples, the connection members 310 may contact the second chip pads 205. The connection members 310 may be, for example, solder bumps or solder balls.

In some embodiments, the second and third semiconductor chips 300a and 300b may be electrically connected to the package substrate 100 through the connection members 310, the redistribution lines 209, and the bonding wires 230. In some examples, the second and third semiconductor chips 300a and 300b may be electrically connected to the package substrate 100 through the connection members 310, the second chip pads 205, the redistribution lines 209, and the bonding wires 230. In some embodiments, the second and third semiconductor chips 300a and 300b may be electrically connected to the transistors TR of the first semiconductor chip 200 through the connection members 310, the redistribution lines 209, the bonding wires 230, and the package substrate 100. In some embodiments, the second and third semiconductor chips 300a and 300b may be electrically connected to the transistors TR of the first semiconductor chip 200 through the connection members 310, the second chip pads 205, the redistribution lines 209, the bonding wires 230, and the package substrate 100. In such a configuration, the transistors TR disposed on the first semiconductor chip 200 may drive internal circuits included in the second and third semiconductor chips 300a and 300b.

According to some embodiments of inventive concepts, the first semiconductor chip 200 may be electrically connected to the second and third semiconductor chips 300a and 300b through the connection members 310, the redistribution lines 209, and the bonding wires 230 (and optionally may include the second chip pads 205), without any other structures between the first semiconductor chip 200 and each of the second and third semiconductor chips 300a and 300b. Accordingly, a minimal transmission distance may be achieved between the first semiconductor chip 200 and the second semiconductor chip 300a and between the first semiconductor chip 200 and the third semiconductor chip 300b. In addition, the first semiconductor chip 200 may easily radiate heat generated therefrom.

The molding layer 400 may be disposed on the package substrate 100. The molding layer 400 may cover the bonding wires 230 and the first, second, and third semiconductor chips 200, 300a, and 300b, and may be disposed in a space between the package substrate 100 and the first semiconductor chip 200, a space between the first semiconductor chip 200 and the second semiconductor chip 300a, and a space between the first semiconductor chip 200 and the third semiconductor chip 300b. For example, the molding layer 400 may include an insulating polymeric material such as an epoxy molding compound.

Figure 3:
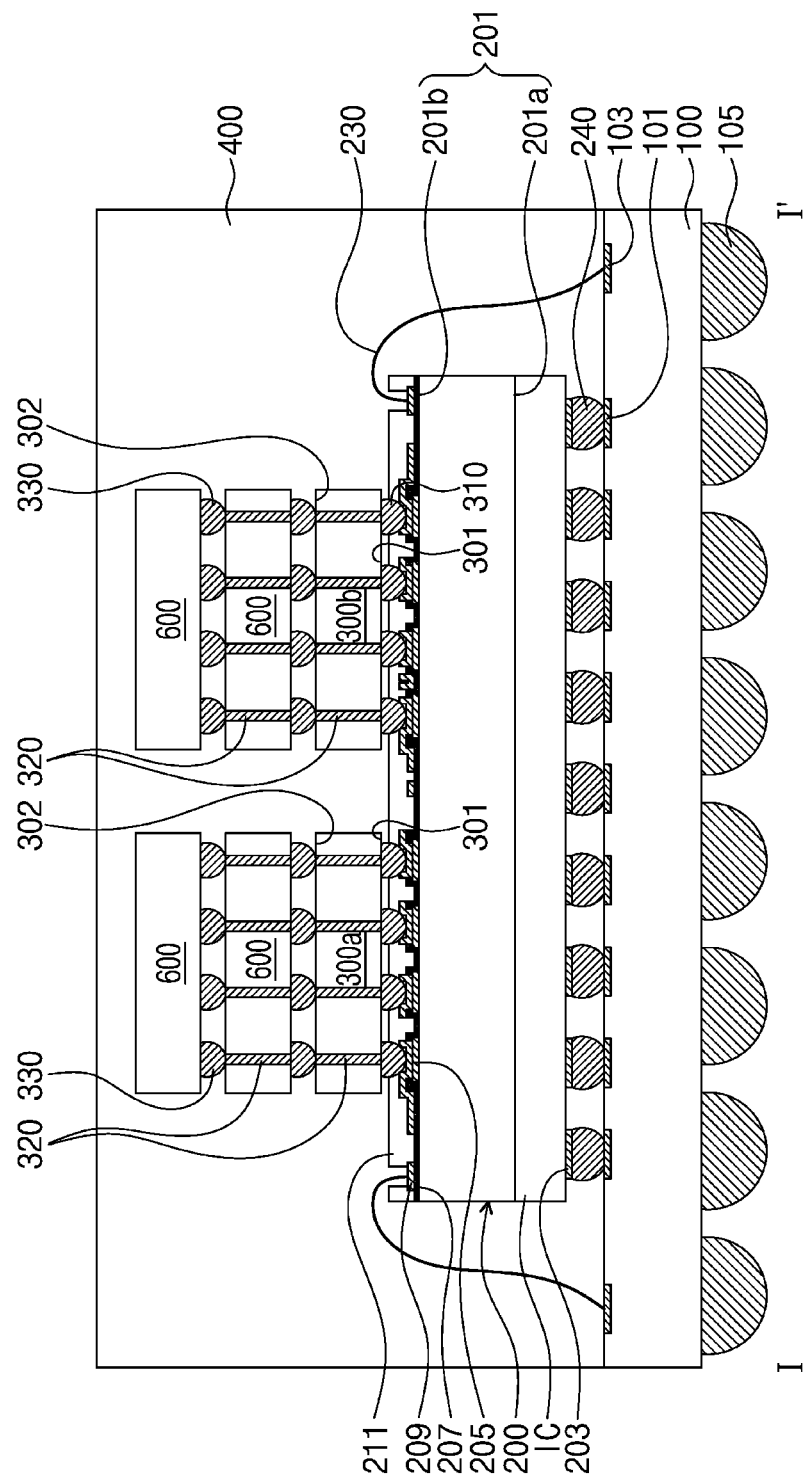
FIG. 3 illustrates a cross-sectional view taken along line I-I' of FIG. 1, showing a semiconductor package according to exemplary embodiments of inventive concepts.

FIG. 3 illustrates a cross-sectional view taken along line I-I' of FIG. 1, showing a semiconductor package according to exemplary embodiments of inventive concepts. In the embodiment that follows, technical features repetitive to those discussed above with reference to FIGS. 1, 2A, and 2B are omitted for brevity of description.

Referring to FIG. 3, a semiconductor package 2000 may include a package substrate 100, a first semiconductor chip 200, a second semiconductor chip 300a, a third semiconductor chip 300b, a plurality of fourth semiconductor chips 600, and a molding layer 400. Each of the second and third semiconductor chips 300a and 300b may include through vias 320. The through vias 320 may be disposed within the second and third semiconductor chips 300a and 300b. The plurality of the fourth semiconductor chips 600 may be vertically stacked on each of the second and third semiconductor chips 300a and 300b. Other through vias 320 may be included in the fourth semiconductor chips 600, but not in top ones of the fourth semiconductor chips 600. The through vias 320 may be disposed within the fourth semiconductor chips 600. In some embodiments, the plurality of the fourth semiconductor chips 600 may be semiconductor memory chips.

Solder balls 330 may be disposed in a space between the second semiconductor chip 300a and its overlying fourth semiconductor chip 600, a space between the third semiconductor chip 300b and its overlying fourth semiconductor chip 600, and spaces between the fourth semiconductor chips 600 vertically adjacent to each other. The second semiconductor chip 300a and the fourth semiconductor chips 600, which chips 300a and 600 vertically overlap each other, may be electrically connected to each other through the solder balls 330 and the through vias 320, and the third semiconductor chip 300b and the fourth semiconductor chips 600, which chips 300b and 600 vertically overlap each other, may be electrically connected to each other through the solder balls 330 and the through vias 320.

Figure 4:
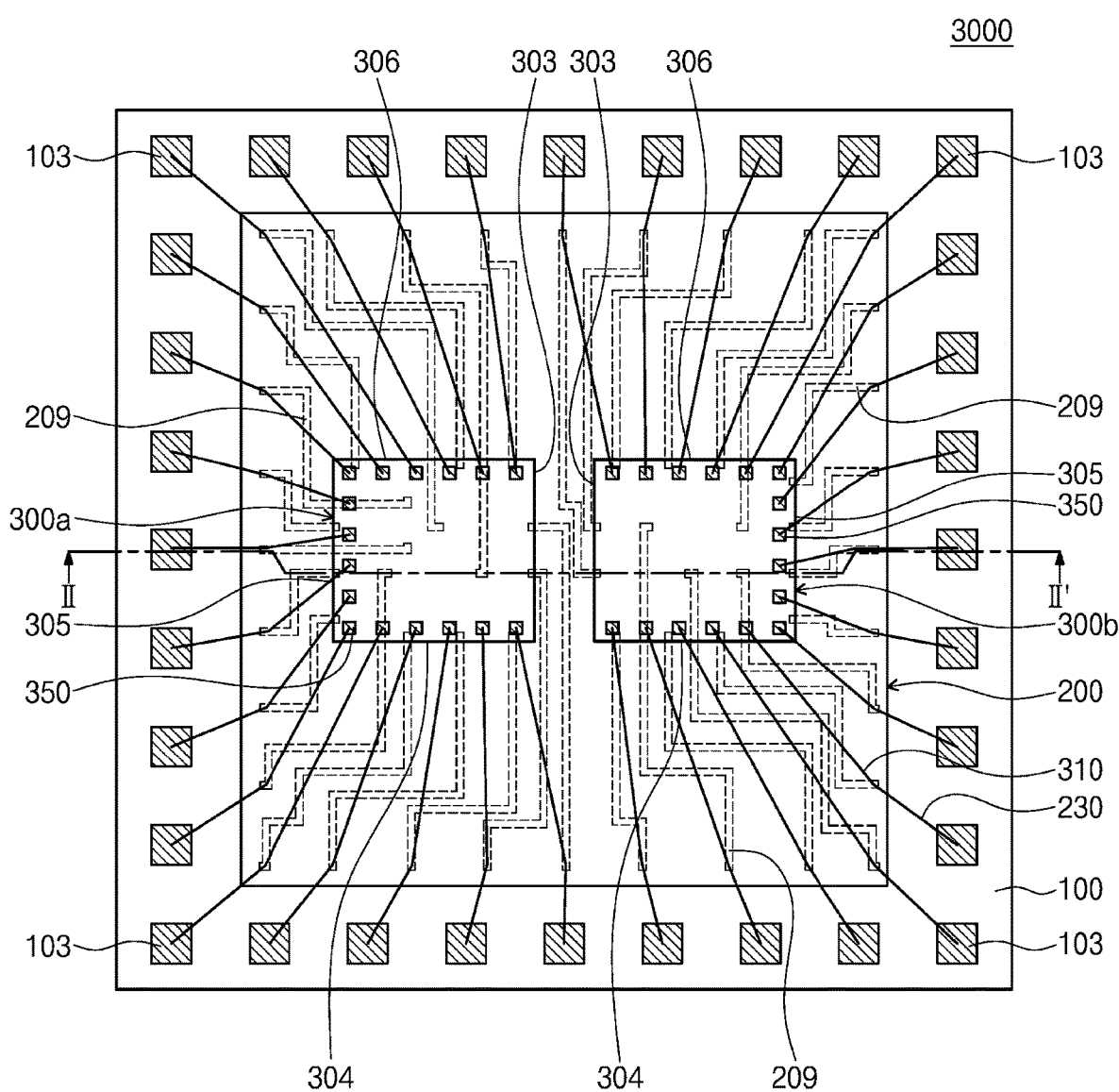
FIG. 4 illustrates a plan view showing a semiconductor package according to exemplary embodiments of inventive concepts.
Figure 5:
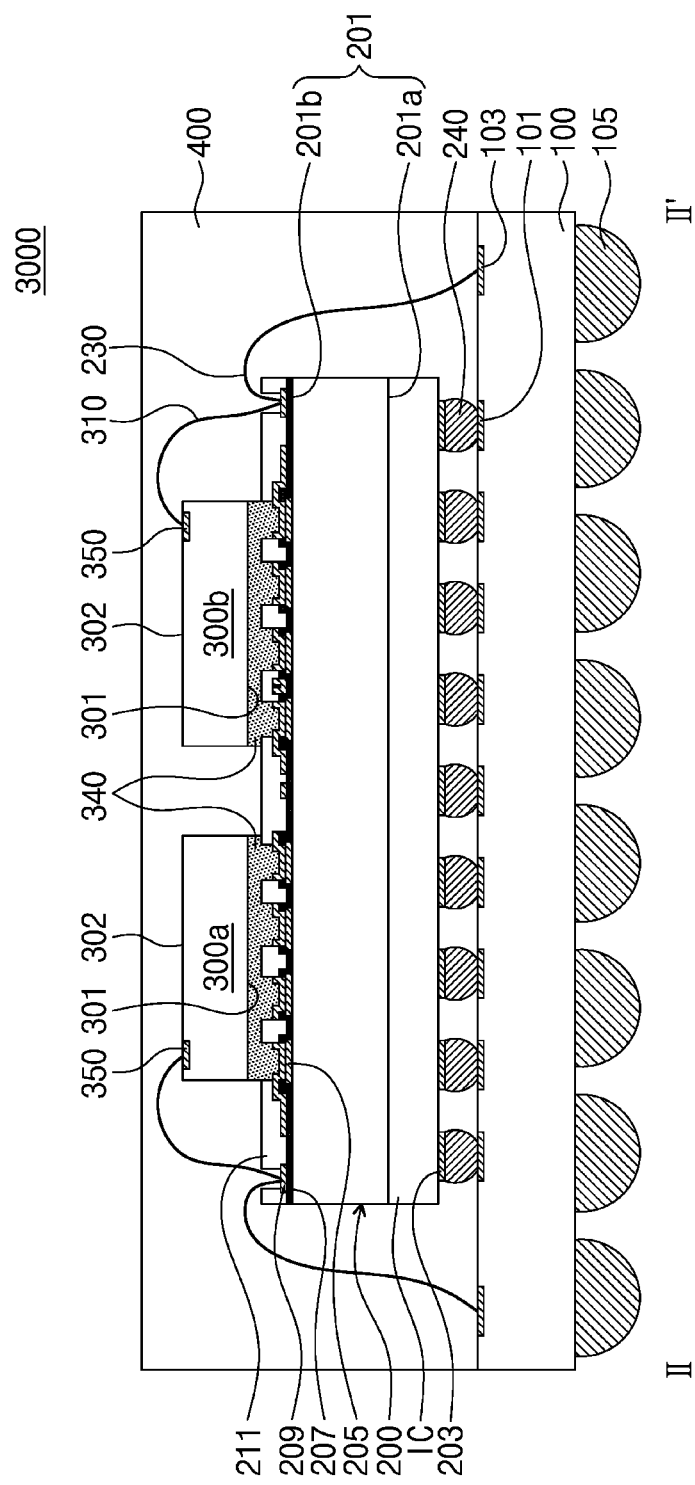
FIG. 5 illustrates a cross-sectional view taken along line II-II' of FIG. 4, showing a semiconductor package according to exemplary embodiments of inventive concepts.

FIG. 4 illustrates a plan view showing a semiconductor package 3000 according to exemplary embodiments of inventive concepts. FIG. 5 illustrates a cross-sectional view taken along line II-II' of FIG. 4, showing a semiconductor package according to exemplary embodiments of inventive concepts. In the embodiment that follows, technical features repetitive to those discussed above with reference to FIGS. 1, 2A, and 2B are omitted for brevity of description. In addition, for brevity of illustration, FIG. 4 omits the second chip pads 205 shown in FIG. 1.

Referring to FIGS. 4 and 5, an adhesive layer 340 may be interposed between a first semiconductor chip 200 and each of second and third semiconductor chips 300a and 300b. The second semiconductor chip 300a and the third semiconductor chip 300b may be adhered through the adhesive layer 340 onto the first semiconductor chip 200. The adhesive layer 340 may be in contact with one surface 301 of each of the second and third semiconductor chips 300a and 300b, one ends of redistribution lines 209, and a portion of a second insulation layer 211. In some examples, the adhesive layer 340 may be in contact with one surface 301 of each of the second and third semiconductor chips 300a and 300b, second chip pads 205, and a portion of a second insulation layer 211. The adhesive layer 340 may be, for example, an epoxy, a silicon-based insulation layer, or a tape.

Each of the second and third semiconductor chips 300a and 300b may include a first side surface 303, a second side surface 304, a third side surface 305, and a fourth side surface 306. The first side surface 303 of the second semiconductor chip 300a may be adjacent to the third semiconductor chip 300b, and the first side surface 303 of the third semiconductor chip 300b may be adjacent to the second semiconductor chip 300a. For example, the first side surfaces 303 of the second and third semiconductor chips 300a and 300b may be adjacent to and face each other.

Third chip pads 350 may be disposed on other surface 302 of each of the second and third semiconductor chips 300a and 300b. The third chip pads 350 may be disposed on the other surface (e.g., an active surface) 302 of each of the second and third semiconductor chips 300a and 300b. For example, the active surface 302 of each of the second and third semiconductor chips 300a and 300b may be electrically connected to internal circuits of each of the second and third semiconductor chips 300a and 300b. In contrast, each of the second and third semiconductor chips 300a and 300b may include the one surface, for example, an inactive surface 301 on which internal circuits are not disposed. When viewed in plan, on the other surface 302 of each of the second and third semiconductor chips 300a and 300b, the third chip pads 350 may be arranged along the second, third, and fourth side surfaces 304, 305, and 306. On the other surface 302 of each of the second and third semiconductor chips 300a and 300b, the third chip pads 350 may not be arranged along the first side surface 303. For example, on the other surface 302 of each of the second and third semiconductor chips 300a and 300b, the third chip pads 350 may be adjacent to the second, third, and fourth side surfaces 304, 305, and 306 except for the first side surface 303. However, FIG. 5 exemplarily shows the third chip pads 350 arranged along the second, third, and fourth side surfaces 304, 305, and 306, but inventive concepts are not limited to that shown. For example, the third chip pads 350 may be arranged along the first, second, third, and fourth side surfaces 303, 304, 305, and 306.

Connection members 310 may be disposed between other ends of the redistribution lines 209 and the other surface 302 of each of the second and third semiconductor chips 300a and 300b. When viewed in plan, the connection members 310 may be disposed between the third chip pads 350 and the other ends of the redistribution lines 209, while crossing over at least one of the first, second, third, and fourth side surfaces 303, 304, 305, and 306 of each of the second and third semiconductor chips 300a and 300b. The connection members 310 may be in contact with the third chip pads 350 and the other ends of the redistribution lines 209. The connection members 310 may be, for example, bonding wires.

In some embodiments, in case where the second and third semiconductor chips 300a and 300b are spaced apart from each other at a narrow space, when viewed in plan, the connection members 310 may neither cross over nor lie on all of the first, second, third, and fourth side surfaces 303, 304, 305, and 306 of each of the second and third semiconductor chips 300a and 300b.

For example, when viewed in plan, the connection members 310 may connect the third chip pads 350 to the other ends of the redistribution lines 209, while crossing over the second, third, and fourth side surfaces 304, 305, and 306 of the second semiconductor chip 300a. When viewed in plan, the connection members 310 may not cross over the first side surface 303 of the second semiconductor chip 300a. For example, when viewed in plan, the connection members 310 may connect the third chip pads 350 to the other ends of the redistribution lines 209, while crossing over the second, third, and fourth side surfaces 304, 305, and 306 of the third semiconductor chip 300b. When viewed in plan, the connection members 310 may not cross over the first side surface 303 of the third semiconductor chip 300b.

Figure 6:
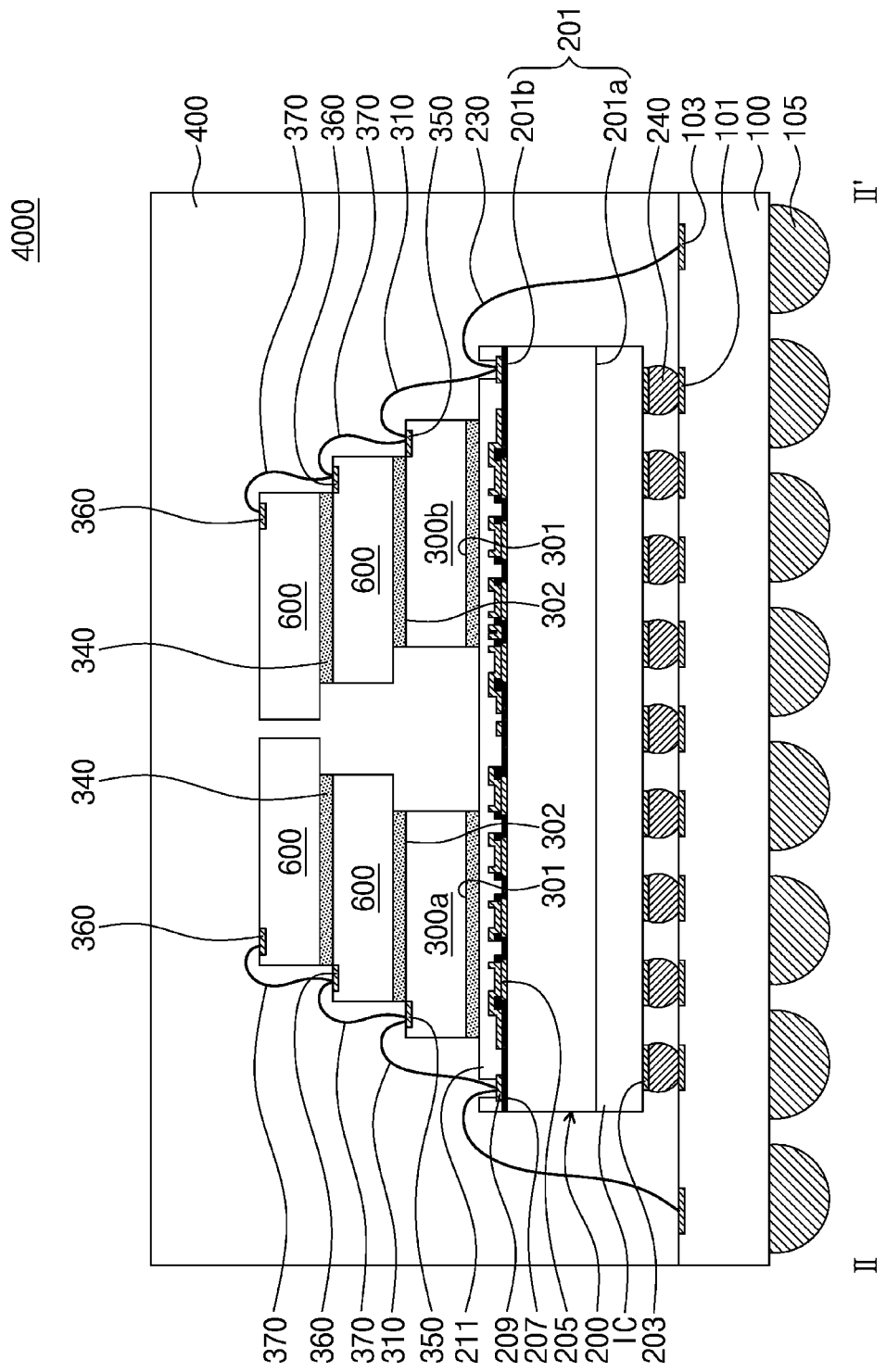
FIG. 6 illustrates a cross-sectional view taken along line II-II' of FIG. 4, showing a semiconductor package according to exemplary embodiments of inventive concepts.

FIG. 6 illustrates a cross-sectional view taken along line II-II' of FIG. 4, showing a semiconductor package 4000 including a plurality of fourth semiconductor chips 600 according to exemplary embodiments of inventive concepts. In the embodiment that follows, technical features repetitive to those discussed above with reference to FIGS. 4 and 5 are omitted for brevity of description.

Referring to FIG. 6, a second insulation layer 211 may be disposed on redistribution lines 209 and a first insulation layer 207. In some examples, the second insulation layer 211 may be disposed on the redistribution lines 209, second chip pads 205, and a first insulation layer 207. For example, the second insulation layer 211 may cover the second chip pads 205, the first insulation layer 207, and portions of the redistribution lines 209. The second insulation layer 211 may partially expose other ends of the redistribution lines 209.

An adhesive layer 340 may be interposed between a first semiconductor chip 200 and each of second and third semiconductor chips 300a and 300b. The second semiconductor chip 300a and the third semiconductor chip 300b may be adhered through the adhesive layer 340 onto the first semiconductor chip 200. The adhesive layer 340 may be in contact with the second insulation layer 211 and one surface 301 of each of the second and third semiconductor chips 300a and 300b.

Connection members 310 may disposed between and electrically connect the other ends of the redistribution lines 209 and other surface 302 of each of the second and third semiconductor chips 300a and 300b.

A plurality of fourth semiconductor chips 600 may be vertically stacked on each of the second and third semiconductor chips 300a and 300b. The fourth semiconductor chips 600 vertically stacked may be adhered to each other through at least one adhesive layer 340. The adhesive layer 340 may be provided to attach one or more chips 600 of the plurality of fourth semiconductor chips 600 onto their underlying second semiconductor chip 300a, and the adhesive layer 340 may be provided to attach one or more chips 600 of the plurality of fourth semiconductor chips 600 onto their underlying third semiconductor chip 300b.

The fourth semiconductor chips 600 stacked on the second semiconductor chip 300a may be sequentially offset to expose third chip pads 350 and fourth chip pads 360 disposed on top surfaces of the second semiconductor chip 300a and the fourth semiconductor chips 600, respectively. For example, the fourth semiconductor chips 600 stacked on the second semiconductor chip 300a may be sequentially offset toward the fourth semiconductor chips 600 stacked on the third semiconductor chip 300b. The fourth semiconductor chips 600 stacked on the third semiconductor chip 300b may be sequentially offset to expose the third chip pads 350 and the fourth chip pads 360 disposed on the top surfaces of the third semiconductor chip 300b and the fourth semiconductor chips 600, respectively. For example, the fourth semiconductor chips 600 stacked on the third semiconductor chip 300b may be sequentially offset toward the fourth semiconductor chips 600 stacked on the second semiconductor chip 300a.

First bonding wires 370 may electrically connect the third and fourth chip pads 350 and 360 that are vertically adjacent to each other, and also electrically connect the fourth chip pads 360 that are vertically adjacent to each other.

Figure 7:
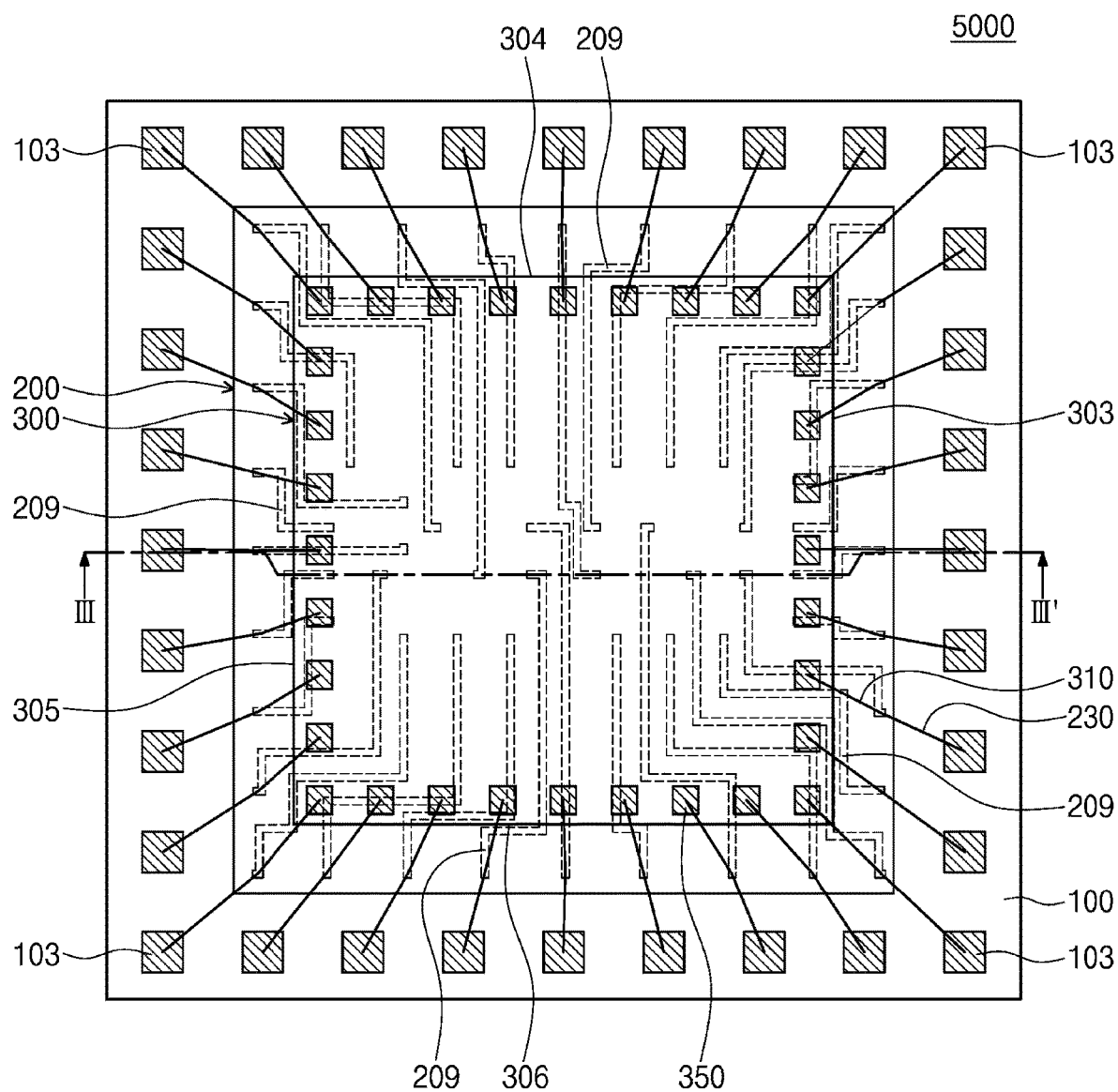
FIG. 7 illustrates a plan view showing a semiconductor package according to exemplary embodiments of inventive concepts.
Figure 8:
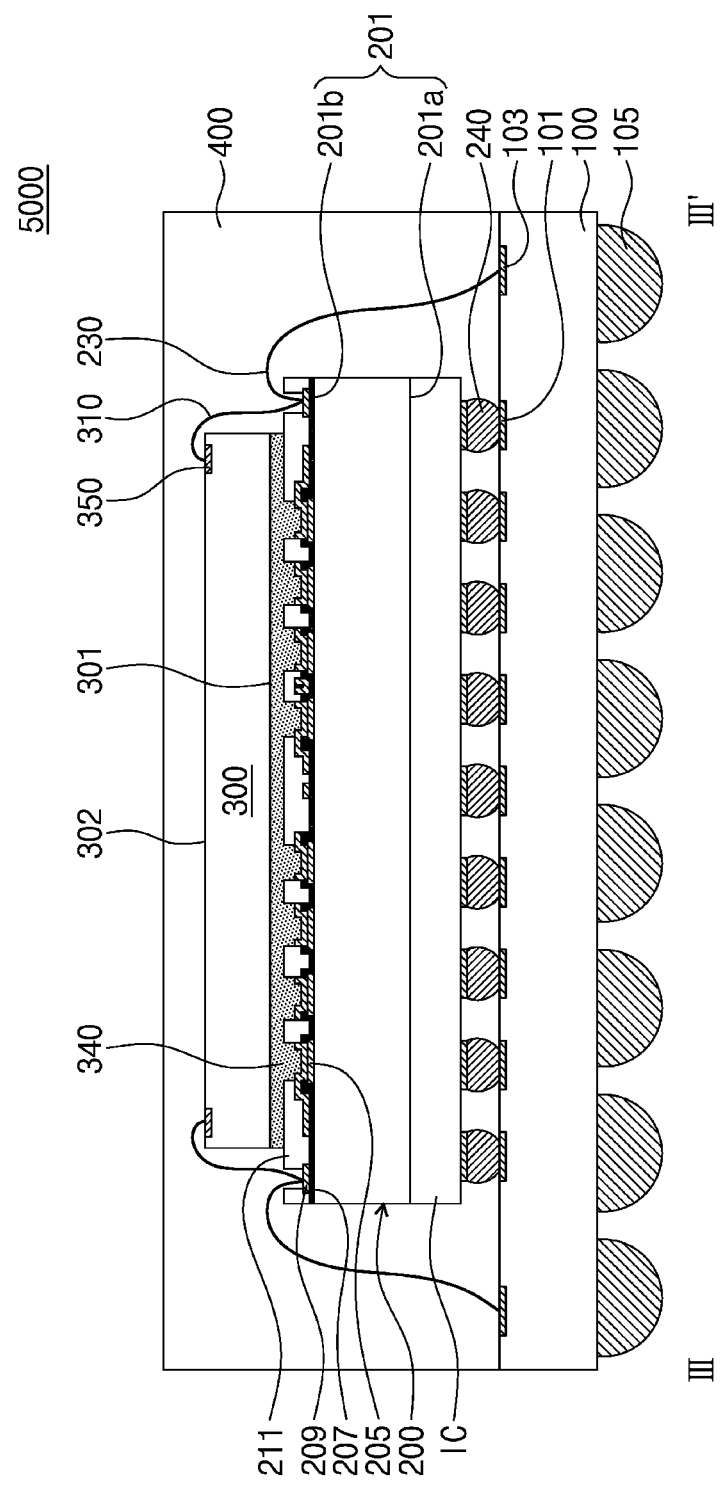
FIG. 8 illustrates a cross-sectional view taken along line of FIG. 7, showing a semiconductor package according to exemplary embodiments of inventive concepts.

FIG. 7 illustrates a plan view showing a semiconductor package 5000 according to exemplary embodiments of inventive concepts. FIG. 8 illustrates a cross-sectional view taken along line of FIG. 7, showing a semiconductor package 5000 according to exemplary embodiments of inventive concepts. In the embodiment that follows, technical features repetitive to those discussed above with reference to FIGS. 4 and 5 are omitted for brevity of description. In addition, for brevity of illustration, FIG. 7 omits the second chip pads 205 shown in FIG. 1.

Referring to FIGS. 7 and 8, a semiconductor package 5000 may include a package substrate 100, a first semiconductor chip 200, a second semiconductor chip 300, and a molding layer 400. The second semiconductor chip 300 may be disposed on the first semiconductor chip 200. An adhesive layer 340 may be interposed between the first semiconductor chip 200 and the second semiconductor chip 300, and thus may attach the second semiconductor chip 300 onto the first semiconductor chip 200. In some embodiments, the second semiconductor chip 300 may be a semiconductor memory chip.

Third chip pads 350 may be disposed on other surface 302 (e.g., an active surface) of the second semiconductor chip 300. On the other surface 302 of the second semiconductor chip 300, the third chip pads 350 may be arranged along side surfaces of the second semiconductor chip 300. For example, on the other surface 302 of the second semiconductor chip 300, the third chip pads 350 may be arranged along a first side surface 303, a second side surface 304, a third side surface 305, and a fourth side surface 306 of the second semiconductor chip 300.

Connection members 310 may be disposed between the other surface 302 of the second semiconductor chip 300 and other ends of redistribution lines 209. The connection members 310 may be in contact with the third chip pads 350 and the other ends of the redistribution lines 209. The connection members 310 may be, for example, bonding wires. When viewed in plan, the connection members 310 may connect the third chip pads 350 to the other ends of the redistribution lines 209, while crossing over the first, second, third, and fourth side surfaces 303, 304, 305, and 306 of the second semiconductor chip 300.

FIGS. 9A to 9H illustrate cross-sectional views showing a method of fabricating a semiconductor package according to exemplary embodiments of inventive concepts.

Referring to FIG. 9A, a substrate 201 may be provided to include an integrated circuit region IC. The substrate 201 may be, for example, a bare wafer. The substrate 201 may be, for example, a silicon substrate, a germanium substrate, or a silicon-germanium substrate. The substrate 201 may have a first surface 201a and a second surface 201b opposite to each other. The substrate 201 may include device regions DR spaced apart from each other in a first direction and a second direction intersecting the first direction, and also include a scribe region SR defining the device regions DR. The device regions DR of the substrate 201 may be areas where semiconductor chips are formed.

Referring to FIG. 9A together with FIG. 2B, the integrated circuit region IC may be formed in each of the device regions DR of the substrate 201. The integrated circuit region IC may be formed in the substrate 201 and on the first surface 201a of the substrate 201. The integrated circuit region IC may include transistors TR, a plurality of interlayer dielectric layers 10, metal lines M, a contact via CV, and vias VI. The transistors TR may be provided in the substrate 201 and on the first surface 201a of the substrate 201. For example, the transistors TR may be constituent parts of a control circuit, a driver circuit, a receiver circuit, a transceiver circuit, and/or a power circuit. The plurality of interlayer dielectric layers 10 may be sequentially formed on the first surface 201a of the substrate 201. The metal lines M may be formed on and between the plurality of interlayer dielectric layers 10. The vias V may be formed between the plurality of interlayer dielectric layers 10, and may electrically connect the metal lines M formed on different interlayer dielectric layers 10. The contact via CV may electrically connect at least one transistor TR (e.g., a source/drain region thereof) to the metal lines M.

First chip pads 203 may be formed in the device regions DR of the substrate 201. The first chip pads 203 may be formed on the first surface 201a (i.e., an active surface) of the substrate 201. For example, the first chip pads 203 may be formed on a top one of the interlayer dielectric layers 10 on the integrated circuit region IC. The first chip pads 203 may be formed spaced apart from each other in the first direction and the second direction intersecting the first direction. Terminals 240 may be formed on the first chip pads 203.

Referring back to FIG. 9A, the terminals 240 may be electrically connected to the first chip pads 203. The terminals 240 may include, for example, one or more of copper (Cu), silver (Ag), platinum (Pt), aluminum (Al), and copper (Cu). The terminals 240 may be formed by a sputtering process, a plating process such as pulse plating or direct-current plating, a soldering process, or an attach process.

A supporter 500 may be provided on the first surface 201a of the substrate 201. The supporter 500 may cover the first chip pads 203 and the terminals 240. The supporter 500 may be a wafer supporting system for handling the substrate 201. The supporter 500 may include an adhesive material, for example, an epoxy, a silicon-based insulation layer, or a tape.

Figure 9B:
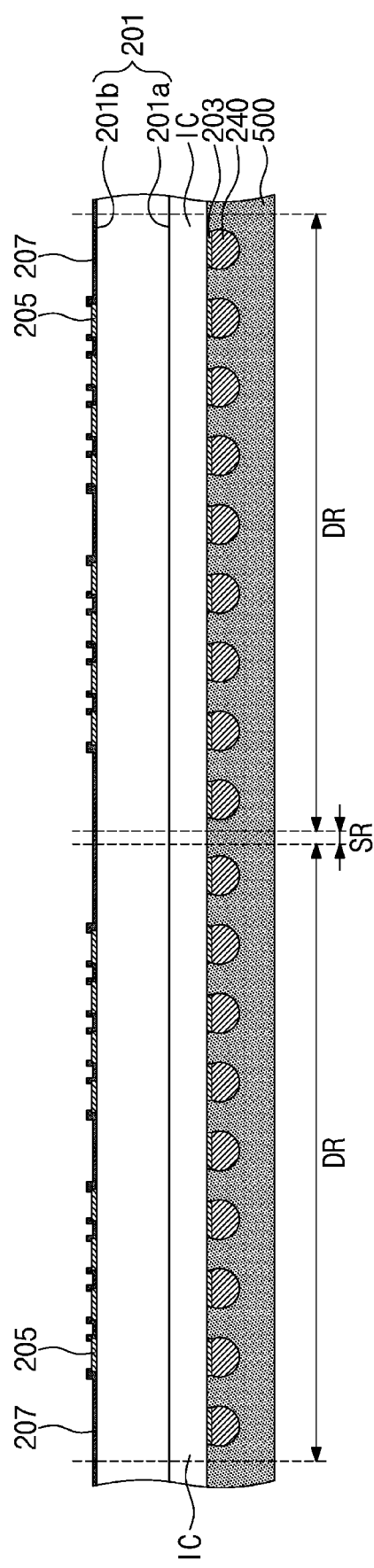

Referring to FIG. 9B, second chip pads 205 may be formed in the device regions DR of the substrate 201. The second chip pads 205 may be formed on the second surface 201b (i.e., an inactive surface) of the substrate 201. The second chip pads 205 may be formed spaced apart from each other in the first direction and the second direction intersecting the first direction.

A first insulation layer 207 may be formed on the second surface 201b of the substrate 201. The first insulation layer 207 may be formed by forming and patterning an insulation layer (not shown) covering the second chip pads 205 and the second surface 201b of the substrate 201. When the insulation layer is patterned, top surfaces of the second chip pads 205 may be exposed by the first insulation layer 207. The first insulation layer 207 may be formed of a single layer or a plurality of layers. The first insulation layer 207 may include, for example, one or more of a silicon oxide layer, a silicon nitride layer, and a silicon oxynitride layer.

Figure 9C:
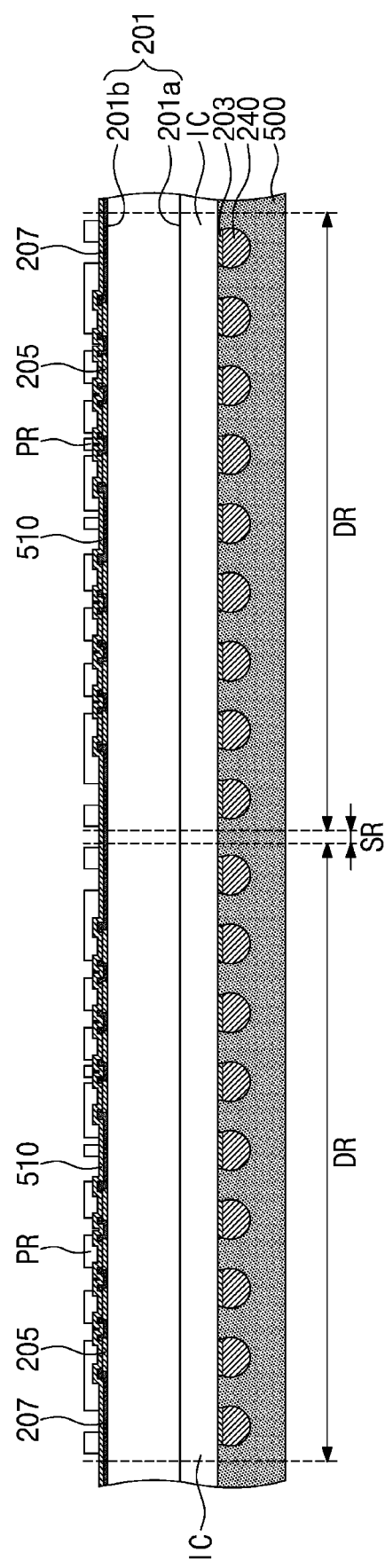

Referring to FIG. 9C, a metal layer 510 may be formed on the second surface 201b of the substrate 201. The metal layer 510 may be formed to cover the top surfaces of the second chip pads 205 and a top surface of the first insulation layer 207. The metal layer 510 may be formed of a single layer or a plurality of layers. The metal layer 510 may include, for example, one or more of aluminum (Al), nickel (Ni), and copper (Cu).

Photoresist patterns PR may be formed on the metal layer 510. The photoresist patterns PR may partially expose the metal layer 510. The photoresist patterns PR may be shaped the same as the redistribution lines 209 discussed above with reference to FIGS. 1 and 2A.

Figure 9D:
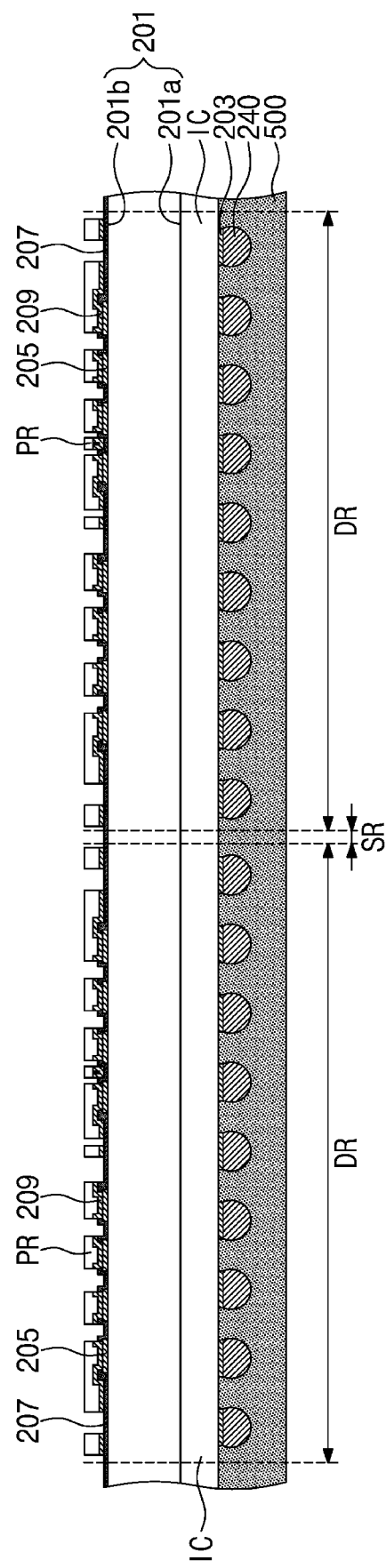

Referring to FIG. 9D, the photoresist patterns PR may be used as an etching mask to partially etch the metal layer 510, which may result in forming redistribution lines 209. The metal layer 510 may be partially etched to expose portions of the top surface of the first insulation layer 207. For example, a dry or wet etching process may be adopted as the etching process. The redistribution lines 209 may be formed in the device regions DR of the substrate 201. As illustrated in FIG. 1, the redistribution lines 209 may be formed to correspond to the second chip pads 205. On the second surface 201b of the substrate 201, the redistribution lines 209 may have linear shapes extending from the second chip pads 205 toward the scribe region SR of the substrate 201. The redistribution lines 209 may have one ends in contact respectively with the top surfaces of the second chip pads 205. On the second surface 201b of the substrate 201, the redistribution lines 209 may have other ends adjacent to the scribe region SR of the substrate 201. After the etching process, the photoresist patterns PR may be removed.

Figure 9E:
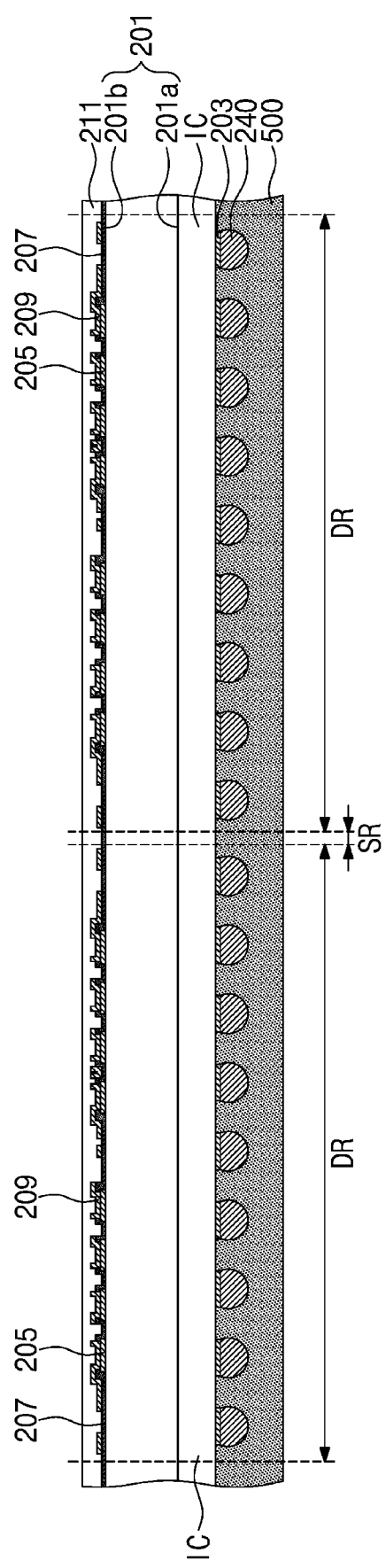

Referring to FIG. 9E, a second insulation layer 211 may be formed on the second surface 201b of the substrate 201. The second insulation layer 211 may be formed to cover the redistribution lines 209 and the top surface of the first insulation layer 207, which top surface is exposed by the redistribution lines 209. The second insulation layer 211 may be formed of a single layer or a plurality of layers. The second insulation layer 211 may include, for example, one or more of a silicon oxide layer, a silicon nitride layer, and a silicon oxynitride layer.

Figure 9F:
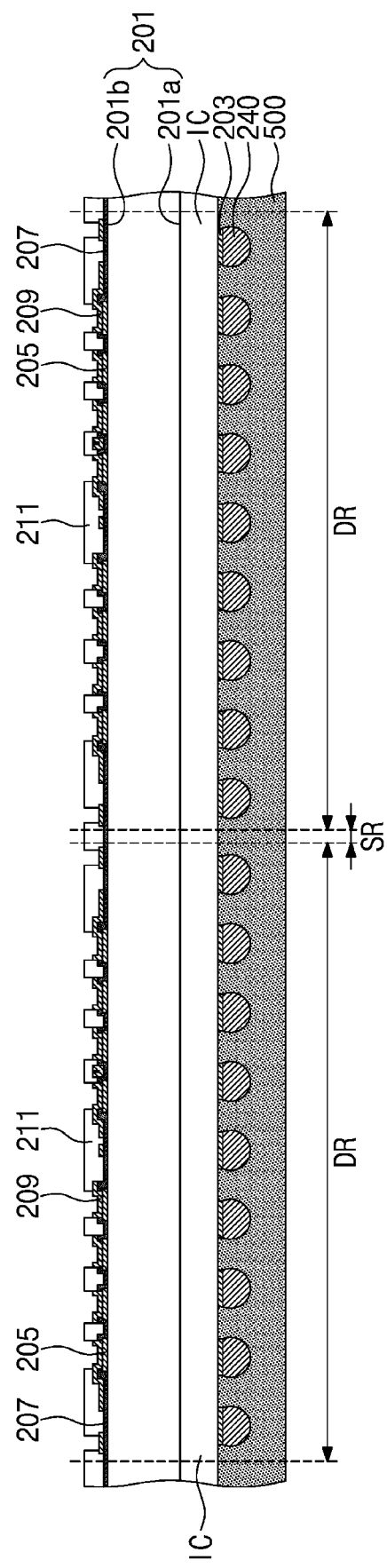

Referring to FIG. 9F, an etching process may be performed on the second insulation layer 211, thereby exposing the one and other ends of the redistribution lines 209. For example, an etching mask pattern (not shown) may be formed on the second insulation layer 211, and the second insulation layer 211 may be etched on its portions exposed by the etching mask pattern. The second insulation layer 211 may cover remaining portions of the redistribution lines 209 except for the one and other ends of the redistribution lines 209.

Figure 9G:
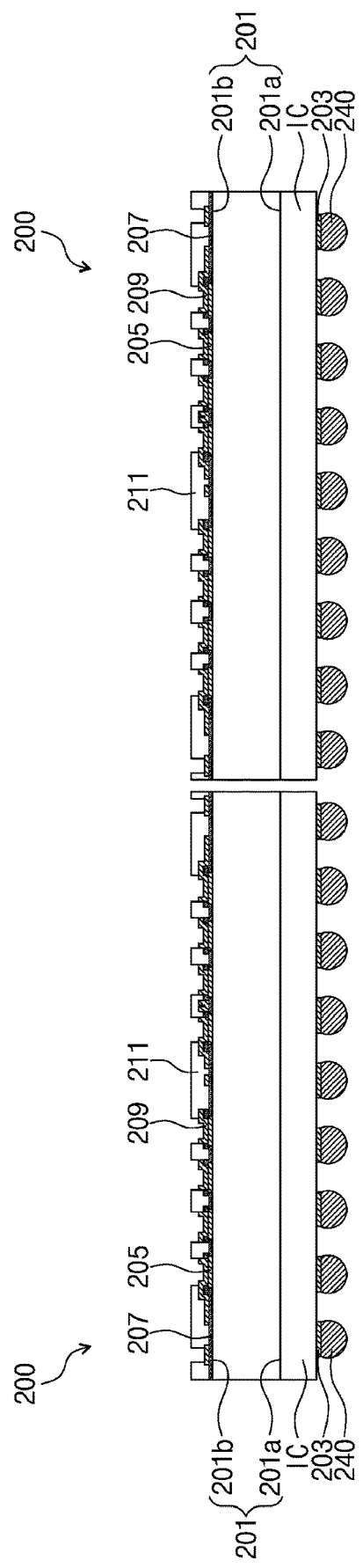

Referring to FIG. 9G, a cutting process may be performed along the scribe region SR of the substrate 201. The cutting process may sequentially cut the second insulation layer 211, the first insulation layer 207, and the supporter 500 that are formed on the scribe region SR of the substrate 201. Therefore, a plurality of first semiconductor chips 200 may be formed. Each of the first semiconductor chips 200 may include a substrate 201, the integrated circuit region IC, the first chip pads 203, the second chip pads 205, the first insulation layer 207, the redistribution lines 209, and the second insulation layer 211. In some embodiments, the first semiconductor chips 200 may be semiconductor logic chips.

After the cutting process, a removal process may be performed on the supporter 500 covering the terminals 240 and the first chip pads 203. Alternatively, the supporter 500 may be removed before the cutting process.

In example embodiments, the redistribution lines 209 may be formed before forming the second chip pads 205. For example, the second chip pads 205 may be disposed on first ends of the redistribution lines 209. In this case, referring to FIG. 9E, the second insulation layer 211 may be formed to cover some portions of the redistribution lines 209, the second chip pads 205, and the top surface of the first insulation layer 207, which top surface is exposed by the redistribution lines 209, and referring to FIG. 9F, an etching process may be performed on the second insulation layer 211, thereby exposing second ends of the redistribution lines 209. For example, an etching mask pattern (not shown) may be formed on the second insulation layer 211, and the second insulation layer 211 may be etched on its portions exposed by the etching mask pattern. The second insulation layer 211 may cover the second chip pads 205 and the remaining portions of the redistribution lines 209 except for the second ends of the redistribution lines 209.

Figure 9H:
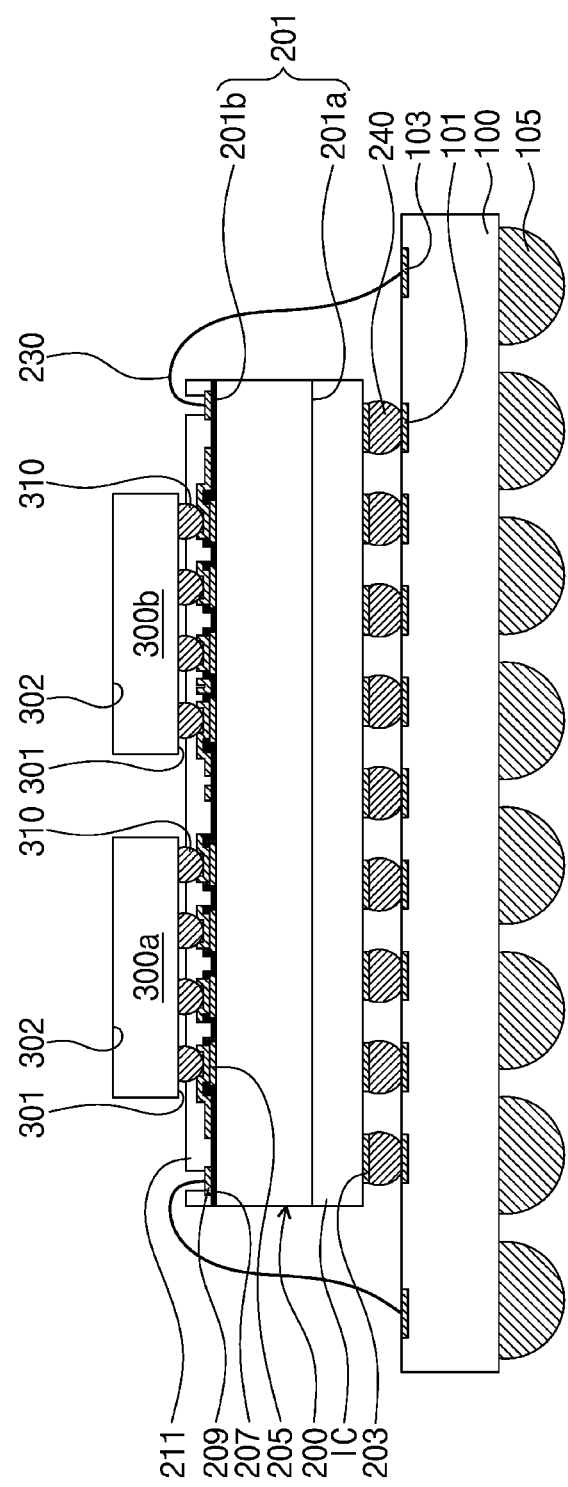

Referring to FIG. 9H, a package substrate 100 may be prepared. The package substrate 100 may be, for example, a printed circuit board (PCB). The package substrate 100 may include first pads 101 and second pads 103. The first pads 101 and the second pads 103 may be disposed on a top surface of the package substrate 100.

External terminals 105 may be formed on a bottom surface of the package substrate 100. The external terminals 105 may include solder balls or solder bumps. The formation order of the external terminals 105 is not be limited to the mentioned above.

The first semiconductor chip 200 may be stacked on the package substrate 100. The terminals 240 may be disposed to correspond to the first pads 101. The first semiconductor chip 200 may be mounted on the package substrate 100 in a flip-chip bonding manner.

A second semiconductor chip 300a and a third semiconductor chip 300b may be stacked on the first semiconductor chip 200. Connection members 310 formed on one surface 301 of each of the second and third semiconductor chips 300a and 300b may be disposed to correspond to one ends of the redistribution lines 209 and the top surfaces of the second chip pads 205. The second and third semiconductor chips 300a and 300b may be mounted on the first semiconductor chip 200 in a flip-chip bonding manner. In this case, the connection members 310 may include, for example, solder bumps or solder balls. Alternatively, as illustrated in FIGS. 4 and 5, the second and third semiconductor chips 300a and 300b may be mounted on the first semiconductor chip 200 in a wire bonding manner. In this case, the connection members 310 may include, for example, bonding wires. In some embodiments, the second and third semiconductor chips 300a and 300b may be semiconductor memory chips.

Bonding wires 230 may be formed between the package substrate 100 and the second surface 201b of the substrate 201. For example, the bonding wires 230 may be formed to extend from other ends of the redistribution lines 209 onto the second pads 103 of the package substrate 100. The bonding wires 230 may include, for example, gold (Au).

Referring back to FIG. 2A, a molding layer 400 may be formed on the package substrate 100. The molding layer 400 may cover the first semiconductor chip 200, the second semiconductor chip 300a, the third semiconductor chip 300b, and the bonding wires 230, and may fill a space between the package substrate 100 and the first semiconductor chip 200, a space between the first semiconductor chip 200 and the second semiconductor chip 300a, and a space between the first semiconductor chip 200 and the third semiconductor chip 300b. The molding layer 400 may include, for example, an insulating polymeric material such as an epoxy molding compound.

According to some exemplary embodiments, a first semiconductor chip and a second semiconductor chip sequentially stacked on a package substrate may be electrically connected to each other through connection members that electrically connect the first and second semiconductor chips to each other, through redistribution lines that are in contact with the connection members and disposed on one surface (e.g., an inactive surface) of the first semiconductor chip adjacent to the second semiconductor chip, and through bonding wires between the redistribution lines and the package substrate, without any other additional structures between the first and second semiconductor chips. Accordingly, it may be possible to minimize or reduce a transmission distance between the first and second semiconductor chips and to easily radiate heat generated in the first semiconductor chip.

Although the present invention has been described in connection with the embodiments of inventive concepts illustrated in the accompanying drawings, it will be understood to those skilled in the art that various changes and modifications may be made without departing from the technical spirit and essential feature of inventive concepts. It will be apparent to those skilled in the art that various substitution, modifications, and changes may be thereto without departing from the scope and spirit of the inventive concepts. Accordingly, all such modifications are intended to be included within the scope of the present invention as defined in the claims.

What is claimed is:

1. A semiconductor package, comprising:
a package substrate;
a first semiconductor chip on the package substrate; and
a second semiconductor chip on the first semiconductor chip,
wherein the first semiconductor chip comprises:
a chip substrate including a first surface and a second surface opposite to the first surface;
a plurality of first chip pads between the package substrate and the chip substrate, and electrically connecting the first semiconductor chip to the package substrate;
a plurality of second chip pads disposed on the second surface of the chip substrate and between the second semiconductor chip and the second surface of the chip substrate;
a plurality of redistribution lines on the second surface of the chip substrate, the redistribution lines electrically connecting to the second semiconductor chip; and
a plurality of first bonding wires electrically connecting the redistribution lines to the package substrate,
wherein the plurality of second chip pads vertically overlap corresponding first ends of the plurality of redistribution lines,
wherein the plurality of second chip pads are disposed between the second surface of the chip substrate and the corresponding first ends of the plurality of redistribution lines,
wherein the corresponding first ends of the plurality of redistribution lines are disposed above the plurality of second chip pads in a first direction, and
wherein the plurality of second chip pads are disposed above the second surface of the chip substrate in the first direction.

2. The semiconductor package of claim 1, wherein the plurality of second chip pads vertically overlap the second semiconductor chip, and
wherein the redistribution lines are correspondingly connected to the second chip pads.

3. The semiconductor package of claim 2, wherein the second semiconductor chip includes a first surface adjacent to the first semiconductor chip and a second surface opposite to the first surface, and
wherein the redistribution lines are electrically connected to the second semiconductor chip through a plurality of connection members disposed between the second chip pads and the first surface of the second semiconductor chip.

4. The semiconductor package of claim 2, wherein:
the redistribution lines extend from the second chip pads toward side surfaces of the chip substrate,
the corresponding first ends of the redistribution lines are in contact with the second chip pads, and
on the second surface of the chip substrate, second ends of the redistribution lines opposite to the corresponding first ends are adjacent to the side surfaces of the chip substrate.

5. The semiconductor package of claim 4, wherein the second semiconductor chip includes a first surface adjacent to the first semiconductor chip and a second surface opposite to the first surface, and
wherein the redistribution lines are electrically connected to the second semiconductor chip through a plurality of connection members disposed between the second surface of the second semiconductor chip and the second ends of the redistribution lines.

6. The semiconductor package of claim 1, wherein the second semiconductor chip further comprises a through via penetrating the second semiconductor chip, and
wherein the semiconductor package further comprises:
a third semiconductor chip on the second semiconductor chip, the third semiconductor chip electrically connected to the second semiconductor chip through the through via; and
a solder ball electrically connected to the through via between the second semiconductor chip and the third semiconductor chip.

7. The semiconductor package of claim 1, further comprising:
a third semiconductor chip on the second semiconductor chip; and
a plurality of second bonding wires electrically connecting the second semiconductor chip to the third semiconductor chip.

8. The semiconductor package of claim 1, wherein the first semiconductor chip further comprises an integrated circuit region adjacent to the first surface of the chip substrate,
wherein an internal circuit included in the integrated circuit region is electrically connected to a corresponding chip pad of the first chip pads, and
wherein the redistribution lines are spaced apart from the integrated circuit region.

9. The semiconductor package of claim 1, further comprising a plurality of terminals disposed between the package substrate and the first surface of the chip substrate and electrically connecting the first semiconductor chip to the package substrate through the first chip pads.

10. The semiconductor package of claim 1, wherein the redistribution lines are electrically connected to the second semiconductor chip through connection members including solder balls, solder bumps, or bonding wires.

11. A semiconductor package, comprising:
a package substrate;
a first semiconductor chip on the package substrate; and
a second semiconductor chip on the first semiconductor chip,
wherein the first semiconductor chip comprises:
a chip substrate comprising a first surface facing the package substrate and a second surface opposite to the first surface, the first surface is an active surface of the first semiconductor chip and the second surface is an inactive surface of the first semiconductor chip;
a plurality of first chip pads between the package substrate and the chip substrate, and the first chip pads electrically connecting a plurality of integrated circuits of the first semiconductor chip to the package substrate;
a plurality of second chip pads disposed on the second surface and between the second semiconductor chip and the second surface;
a plurality of redistribution lines on the second surface, the redistribution lines electrically connected to the second semiconductor chip; and
a plurality of bonding wires electrically connecting the redistribution lines to the package substrate,
wherein the plurality of second chip pads vertically overlap corresponding first ends of the plurality of redistribution lines, and
wherein the plurality of second chip pads are disposed between the second surface of the chip substrate and the corresponding first ends of the plurality of redistribution lines.

12. The semiconductor package of claim 11, further comprising a plurality of terminals disposed between the package substrate and the first surface of the chip substrate and electrically connecting the first chip pads of the first semiconductor chip to the package substrate.

13. The semiconductor package of claim 12, wherein the integrated circuits are part of an integrated circuit region that is adjacent to the first surface of the chip substrate, and
wherein the terminals are in contact with the integrated circuits of the first semiconductor chip.

14. The semiconductor package of claim 11, wherein the plurality of second chip pads on the second surface of the chip substrate vertically overlap the second semiconductor chip, and
wherein the redistribution lines are correspondingly connected to the second chip pads.

15. The semiconductor package of claim 14, wherein the second semiconductor chip comprises a first surface adjacent to the first semiconductor chip and a second surface opposite to the first surface,
wherein the redistribution lines are electrically connected to the second semiconductor chip through a plurality of connection terminals,
wherein the connection terminals are disposed between the second chip pads and the first surface of the second semiconductor chip, and
wherein the connection terminals comprise solder balls or solder bumps.

16. The semiconductor package of claim 14, wherein:
the redistribution lines extend from the second chip pads toward side surfaces of the chip substrate,
the corresponding first ends of the redistribution lines are in contact with the second chip pads, and
on the second surface of the chip substrate, second ends of the redistribution lines are adjacent to the side surfaces of the chip substrate.

17. The semiconductor package of claim 16, wherein the second semiconductor chip comprises a first surface adjacent to the first semiconductor chip and a second surface opposite to the first surface,
wherein the redistribution lines are electrically connected to the second semiconductor chip through a plurality of connection members,
wherein the connection members are disposed between the second surface of the second semiconductor chip and the second ends of the redistribution lines, and wherein the connection members comprise bonding wires.

18. A semiconductor device, comprising:

a package substrate;

a first semiconductor chip on the package substrate; and a second semiconductor chip disposed on and electrically connected to the first semiconductor chip, wherein the first semiconductor chip comprises:

a chip substrate including a first surface and a second surface opposite to the first surface;

an integrated circuit region including a plurality of integrated circuits adjacent to the first surface of the chip substrate;

a plurality of first chip pads at the first surface of the chip substrate, the first chip pads electrically connected to the integrated circuits;

a plurality of second chip pads disposed on the second surface of the chip, substrate and between the second semiconductor chip and the second surface of the chip substrate; and a plurality of redistribution lines on the second surface of the chip substrate, the redistribution lines electrically connected to the package substrate through connection members, wherein the redistribution lines are spaced apart from the integrated circuit region, wherein the redistribution lines include first ends contacting the second chip pads, and extend from the first ends to second ends of the redistribution lines toward side surfaces of the chip substrate, wherein the second chip pads vertically overlap corresponding first ends of the redistribution lines, wherein the corresponding first ends of the plurality of redistribution lines are disposed above the second chip pads in a first direction, and wherein the second chip pads are disposed above the second surface of the chip substrate in the first direction.

19. The semiconductor device of claim 18, wherein the second semiconductor chip includes a first surface adjacent to the first semiconductor chip and a second surface opposite to the first surface of the second semiconductor chip, wherein the redistribution lines are electrically connected to the second semiconductor chip through a plurality of connection members, and wherein the connection members are disposed between the second chip pads and the first surface of the second semiconductor chip, or wherein the connection members are disposed between the second surface of the second semiconductor chip and the second ends of the redistribution lines.

* * * * *